US 6,261,367 B1
Jul. 17, 2001

(54) METHOD AND APPARATUS FOR DISPENSING LIQUID MATERIAL

(75) Inventor: William E. Donges, Wellington, OH (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/307,949

(22) Filed: May 10, 1999

(51) Int. Cl.[7] ............................... B05B 1/02; B05B 9/00; B05B 1/34
(52) U.S. Cl. .................. 118/305; 118/300; 118/323; 156/356; 239/597; 239/601
(58) Field of Search .................... 156/350, 356, 156/362, 578; 118/300, 302, 323, 305; 427/96, 256, 261, 421; 221/1; 239/597, 601, 599, 584, 585.3

(56) References Cited

U.S. PATENT DOCUMENTS

| | | |
|---|---|---|
| 3,858,812 | 1/1975 | Williams et al. ............ 239/599 |
| 4,337,281 | 6/1982 | Boone .................... 427/236 |
| 4,346,849 | 8/1982 | Rood . | 
| 4,349,947 | 9/1982 | Rood . |
| 4,579,286 * | 4/1986 | Stoudt ................... 239/568 |
| 4,753,819 * | 6/1988 | Shimada ................. 427/96 |
| 4,954,059 | 9/1990 | Lee et al. ............... 425/72.1 |
| 5,017,409 | 5/1991 | Bok . |
| 5,462,199 * | 10/1995 | Lenhardt ................ 222/54 |
| 5,747,102 | 5/1998 | Smith et al. . |
| 6,036,106 * | 3/2000 | Peet .................... 239/135 |
| 6,060,125 * | 5/2000 | Fujii .................... 427/421 |

* cited by examiner

Primary Examiner—Richard Crispino
Assistant Examiner—J. A. Lorengo
(74) Attorney, Agent, or Firm—Wood, Herron & Evans, LLP

(57) ABSTRACT

A liquid material dispensing system includes a nozzle tip that is adapted to dispense droplets of liquid material that expand in flight toward a substrate. The droplets elongate in orthogonal directions in a plane that is substantially transverse to the direction of travel of the droplets toward the substrate. Preferably, each droplet elongates in pattern width and in pattern length during its flight toward the substrate. The elongated droplets impact the substrate and contact adjacent droplets to form a generally rectangular layer of liquid material within a predetermined area on the substrate. Methods for forming a generally rectangular layer of liquid material on a substrate are also disclosed.

15 Claims, 5 Drawing Sheets

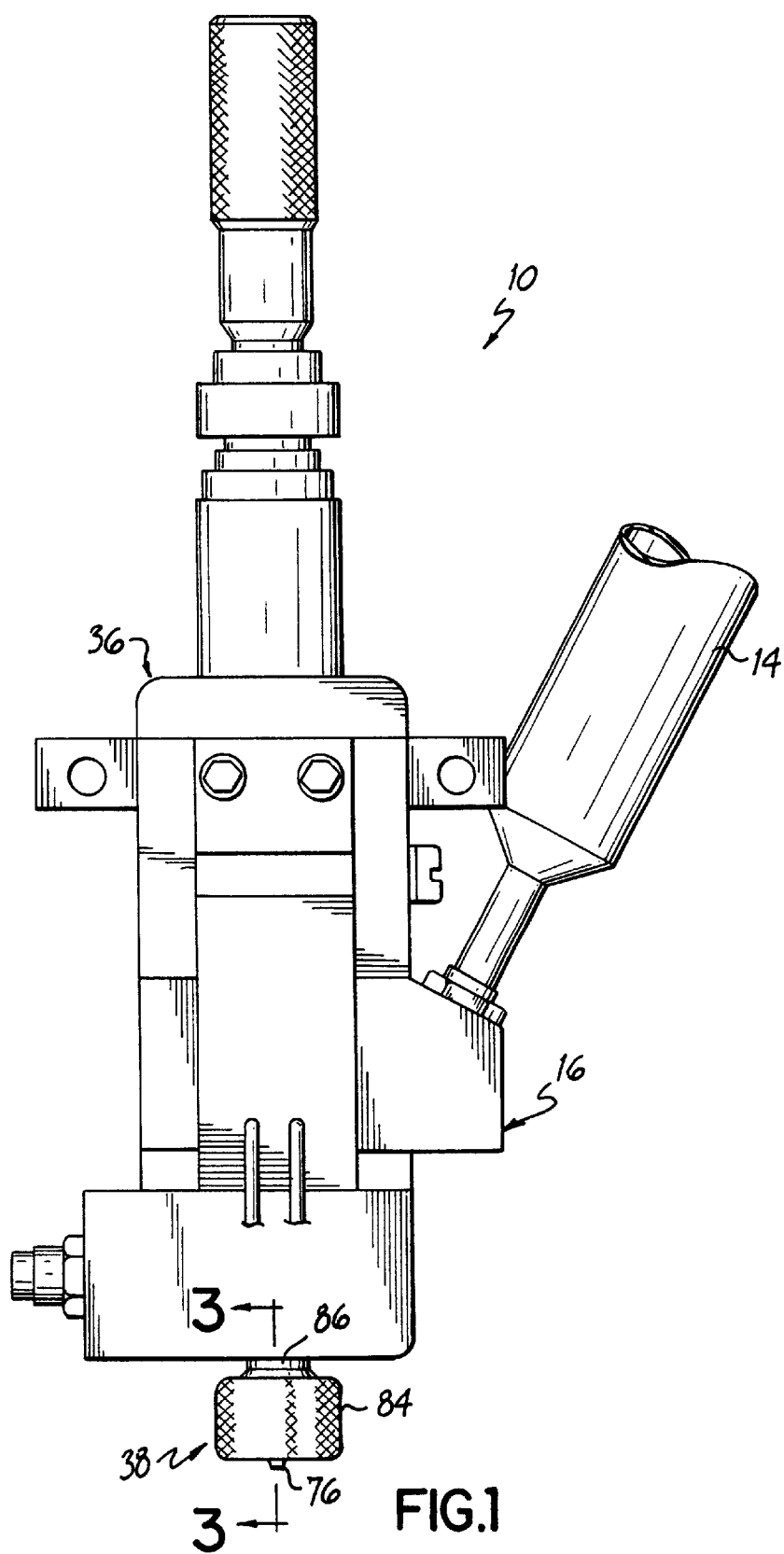

METHOD AND APPARATUS FOR DISPENSING LIQUID MATERIAL

FIELD OF THE INVENTION

The present invention relates generally to the field of liquid material dispensing and, more particularly, to an apparatus and method for dispensing liquid or viscous materials such as solder fluxes, adhesives, epoxies or other materials onto an electronic circuit substrate.

BACKGROUND OF THE INVENTION

Liquid dispensing systems have become an integral part of the electronics manufacturing process for depositing underfill, encapsulants, solder fluxes, surface mount adhesives, conformal coatings and other materials onto a substrate, such as a printed circuit board. Each liquid dispensing system used in the electronics manufacturing process has a particular dispensing characteristic that is determined in large measure by the desired liquid dispense pattern on the substrate, the liquid flow rate and/or liquid viscosity of the dispensed material, and the desired electronic component assembly throughput through the dispensing system.

For example, in the assembly of ball gate arrays (BGA's) and other electronic components onto a ceramic or FR-4 substrate, the component must be soldered onto the substrate to form the necessary electrical interconnections. As each component occupies a predetermined area on the substrate, the liquid dispensing system must have the capability to dispense liquid or viscous material in a controlled manner within the selected component areas. Typically, the liquid dispenser is mounted on a movable platform to provide automated and accurate movement of the liquid dispenser in three dimensions relative to the substrate with the aid of a machine vision system.

Prior to the component soldering process for establishing the electrical interconnections, it is often necessary or at least desirable to dispense a layer of solder flux onto a substrate within rectangular areas associated with each component. To provide this capability, liquid material dispensers have been developed in the past that use filled syringes or reservoirs of solder flux, and dispensing valves to dispense droplets of flux material onto the substrate in a controlled manner with up to 25,000 to 40,000 dots of fluid per hour for a typical dispenser platform. These liquid dispensers, known as "dot jetting" dispensers, are programmed to dispense an array of liquid or viscous material droplets within each selected rectangular area which are then allowed to flow into contact with each other to form a generally rectangular thin layer of flux within the component area. However, notwithstanding the advances made in the electronics manufacturing process through "dot jet" dispensing of solder flux onto a substrate, the "dot jet" dispensing process has several drawbacks or limitations.

For example, in the "dot jet" process, each dispensed droplet has a generally circular configuration. To effectively cover or form a liquid layer in a rectangular area on the substrate, material flow of adjacent "dots" or "dot" overlap is required. These dispensing techniques can result in too much material being dispensed within the predetermined component area, or surface tension changes in the dispensed material that do not allow the "dots" to flow as desired. Moreover, due to the relatively small diameter of the "dots", more dispense cycles are required per unit area of coverage which can result in reduced throughput of electronic assemblies through the dispensing system.

Thus, there is a need for a liquid dispensing system and method that more effectively forms generally rectangular liquid layers on a substrate. There is also a need for a liquid dispensing system and method that improves throughput of assemblies through the dispensing system for forming rectangular liquid layers on a substrate.

SUMMARY OF THE INVENTION

The present invention overcomes the foregoing and other shortcomings and drawbacks of liquid dispensing systems and methods heretofore known for forming generally rectangular liquid layers on a substrate. While the invention will be described in connection with certain embodiments, it will be understood that the invention is not limited to these embodiments. On the contrary, the invention includes all alternatives, modifications and equivalents as may be included within the spirit and scope of the present invention.

The liquid dispensing system of the present invention is particularly adapted for forming generally rectangular liquid layers on an electronic substrate. The dispensing system includes a nozzle tip that is configured to dispense liquid material droplets that elongate in pattern width and in pattern length during their flight toward the substrate. The elongated droplets impact the substrate and contact adjacent droplets to form generally rectangular liquid layers within predetermined component areas on the substrate.

The nozzle tip has an upper end adapted to be placed in fluid communication with an outlet end of the liquid dispensing system, and an opposite lower end adapted to face the substrate. An upper elongated groove or cavity is formed on the upper end of the nozzle tip, and a lower elongated groove or cavity is formed on the lower end. The upper and lower grooves extend inwardly into the nozzle tip and intersect each other to form a liquid dispensing outlet. Preferably, the liquid dispensing outlet is configured to provide liquid impingement at the dispensing outlet for dispensing droplets of liquid material that elongate in a plane generally transverse to the direction of travel of the droplets in flight toward the substrate.

The nozzle tip includes a pair of oppositely disposed chamfered end portions formed proximate the lower end of the nozzle tip that define opposite terminal ends of the lower groove. Each chamfered end portion includes a pair of inclined walls that extend outwardly and away from the lower end of the nozzle tip. A nozzle tip holder is mounted adjacent the outlet end of the liquid dispensing system for supporting the nozzle tip. The nozzle tip holder includes opposite pairs of inclined walls that form generally linear extensions of the inclined walls formed on the nozzle tip. A nozzle cap is mounted adjacent the outlet end of the liquid dispensing system for supporting the nozzle tip holder.

The liquid dispensing system of the present invention eliminates the need to provide for dwell to allow droplets to flow into contact with each other, and also eliminates the need to overlap adjacent droplets to form a generally rectangular layer of liquid material on the substrate, thereby resulting in enhanced throughput of electronic assemblies through the dispensing system.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a side elevational view of a liquid dispensing system in accordance with the principles of the present invention;

DETAILED DESCRIPTION OF THE PREFERRED EMBODIMENT

Figure 2A:
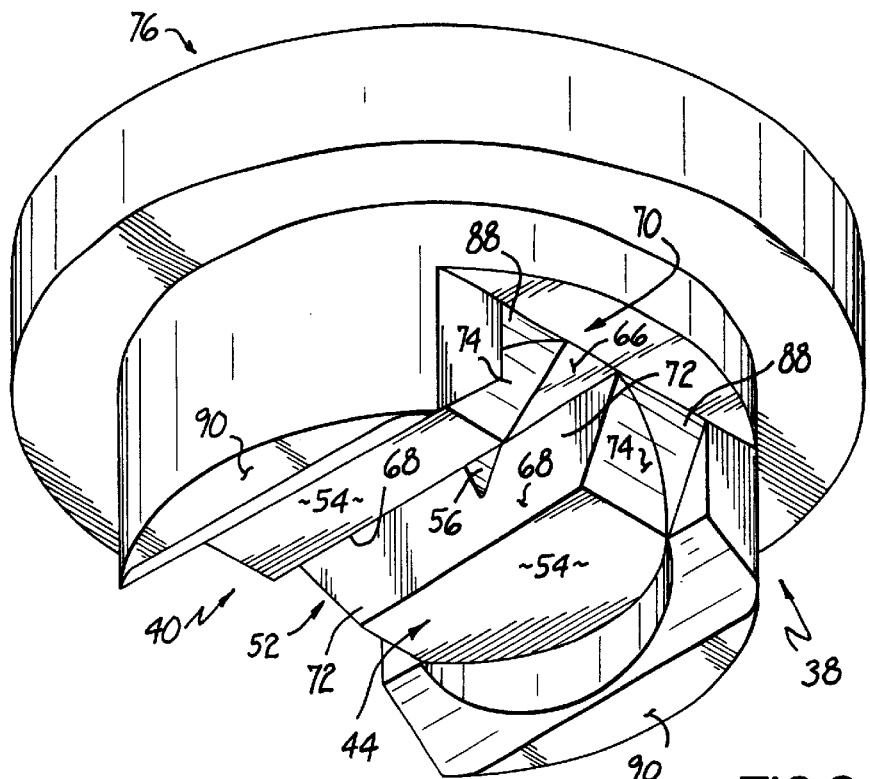
FIG. 2A is an enlarged perspective view illustrating an assembled nozzle tip and nozzle tip holder for use with the liquid dispensing system of FIG. 1.

With reference to the figures, a liquid dispensing system 10 for dispensing a layer of liquid or viscous material onto a substrate 12 (FIGS. 4A–4C and 5) such as a printed circuit board is shown in accordance with the principles of the present invention. Liquid dispensing system 10 includes a standard, commercially available syringe 14 filled with liquid or viscous material, such as solder flux, surface mount adhesive, epoxy or other material, that is fluidly connected to a housing 16 of the dispensing system 10. While not shown, it will be appreciated that syringe 14 could be replaced with a typical fluid material reservoir as known in the art. As will be appreciated by those of ordinary skill in the art, housing 16 includes an elongated flow bore 18 (FIG. 3) that forms a flow passage 20 generally aligned with a longitudinal axis of the dispensing system 10. Flow passage 20 fluidly communicates at one end with an output of syringe 14, and at the other end with an outlet end 22 (FIG. 3) of the dispensing system 10 from which the pressurized liquid or viscous material is dispensed as will be described in detail below.

An air tube (not shown) is connected to a pressure regulator (not shown) and a source of low pressure air (not shown). The air tube (not shown) has one end connected to an inlet (not shown) of syringe 14 to force the liquid or viscous material, typically having a viscosity of between about 20 and about 500 centipoise, into flow passage 20 of dispensing system 10 at a constant pressure between about 4 PSI and about 30 PSI. While not shown, it will be appreciated that liquid dispensing system 10 is mounted on a movable platform for moving the dispensing system 10 in a controlled manner relative to the substrate 12. For a more detailed description of the structure and operation of liquid dispensing system 10, the reader is referred to U.S. Pat. No. 5,747,102, assigned to the common assignee, which is hereby incorporated by reference herein in its entirety.

Briefly, liquid dispensing system 10 includes a cup-shaped valve seat assembly 24 (FIG. 3) that is press fit, soldered or otherwise mounted within a lower end of flow bore 18 adjacent to the outlet end 22 of dispensing system 10. Valve seat assembly 24 has a flow passage 26 that fluidly communicates with the flow passage 20 extending through housing 16. An outlet opening 28 and associated valve seat 30 are formed on the lower end of valve seat assembly 24 for cooperation in known manner with a vertically reciprocal valve stem 32.

More particularly, valve stem 32 has a lower valve head 34 adapted for sealing engagement with valve seat 30 to normally close outlet opening 28. An opposite upper end (not shown) of valve stem 32 is engaged with a control mechanism 36 of dispensing system 10 for controlled, reciprocal movement of valve head 34 into and out of engagement with valve seat 30. With valve head 34 positioned in a retracted position away from valve seat 30 by operation of control mechanism 36, liquid or viscous material is permitted to flow through the outlet opening 28 of valve seat assembly 24 and through the outlet end 22 of dispensing system 10. While valve stem 32 is illustrated with a spherical valve head 34, it will be appreciated that other valve head shapes are possible without departing from the spirit and scope of the present invention. Also, while not shown, it will be appreciated that a heating element may be disposed adjacent valve seat assembly 24 for heating a small volume of liquid or viscous material in the valve seat assembly 24 as described in detail in U.S. Pat. No. 5,747,102 which is incorporated herein by reference.

Figure 2B:
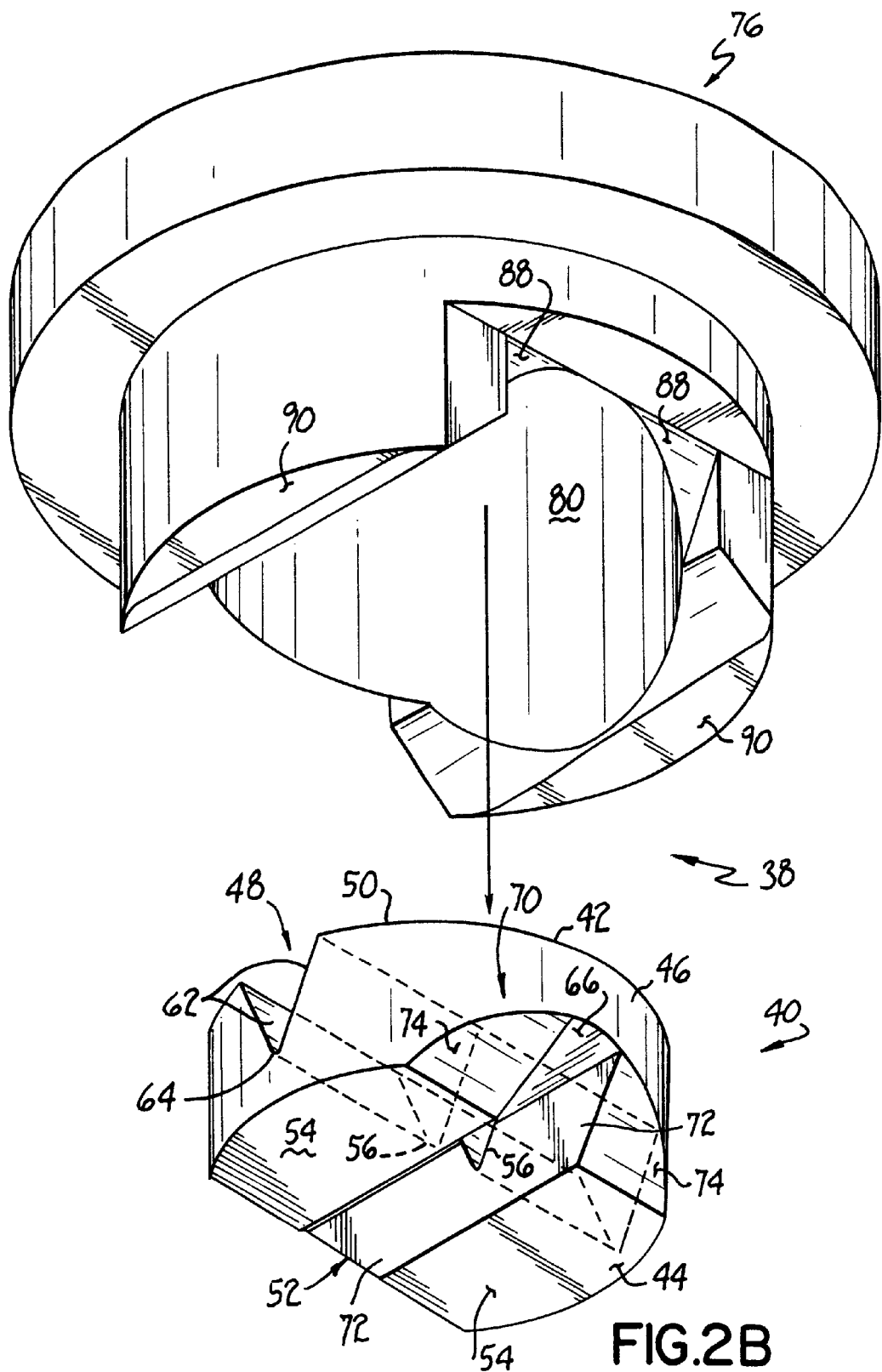
FIG. 2B is an enlarged disassembled view of the nozzle tip and nozzle tip holder illustrated in FIG. 2A.
Figure 3:
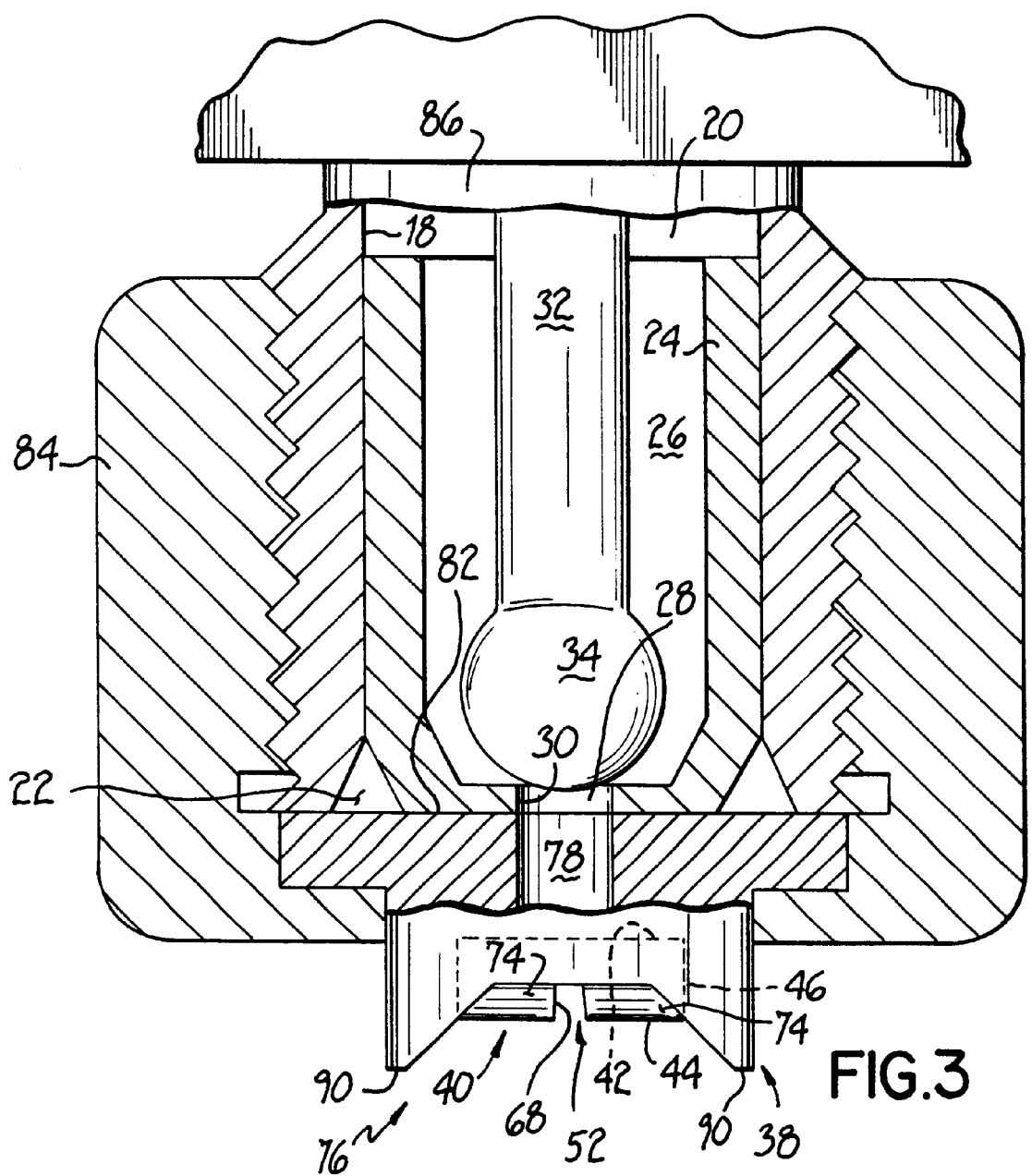
FIG. 3 is a cross-sectional view taken along line 3—3 of FIG. 1.

A principle feature of the present invention relates to nozzle assembly 38, shown most clearly in FIGS. 2A, 2B and 3, which is mounted in fluid communication with the outlet end 22 of liquid dispensing system 10. With reference to the disassembled view of FIG. 2B, nozzle assembly 38 includes a nozzle tip 40, preferably made from a cylindrical disc of hardened tungsten carbide, having an upper end 42 adapted to be placed in fluid flow communication with the outlet end 22 of dispensing system 10, a lower end 44 adapted to face substrate 12 (FIGS. 4A–4C and 5), and a cylindrical wall 46 extending between upper and lower ends 42 and 44. In one embodiment of the present invention for dispensing solder flux, nozzle tip 40 has a thickness dimension of about 0.040 to about 0.050 in. between the upper and lower ends 42 and 44, and a cylindrical diameter of about 0.120 in. It will be appreciated by those of ordinary skill in the art, however, that the various dimensions of nozzle tip 40 may change according to the desired liquid material dispense pattern from the tip as described in detail below.

Nozzle tip 40 is preferably formed as a double-cut liquid impingement nozzle including an elongated groove or cavity 48 formed in an upper, generally planar face 50 of upper end 42, and a generally transverse elongated groove or cavity 52 formed in a lower, generally planar face 54 of lower end 44. The elongated grooves 48 and 52 extend inwardly into the nozzle tip 40 from respective faces 50 and 54 and intersect each other to form a liquid dispensing outlet 56. As will be described in more detail below, the liquid dispensing outlet 56 of nozzle tip 40 is particularly configured to create liquid impingement at the dispensing outlet 56 for dispensing droplets 58 (FIGS. 4A–4C and 5) of liquid or viscous material toward substrate 12 that elongate in flight in a plane that is substantially transverse to a direction of travel of the droplets 58, indicated diagrammatically at 60. Preferably, the direction of travel 60 of droplets 58 is substantially transverse to a plane defined by substrate 12. For a more detailed description on the formation of the elongated grooves 48 and 52 in nozzle tip 40, the reader is referred to U.S. Pat. No. 4,346,849, assigned to the common assignee, which is hereby incorporated herein by reference in its entirety.

Further referring to FIGS. 2A and 2B, groove 48 on the upper end 42 of nozzle tip 40 preferably has a cross-section substantially in the shape of a wedge having substantially flat side walls 62 diverging from apex 64 at an angle in a range between about 20° to about 140°. Groove 52 on the lower end 44 of nozzle tip 40 has a cross-section substantially in the shape of an isosceles trapezoid, with a generally flat bottom wall 66 parallel to upper and lower faces 50, 54, and a pair of side walls 68 that slope away from bottom wall 66 and join the lower face 54. Preferable angles between the side walls 68 and the bottom wall 66 are in a range between about 90° to about 148°. The wedge-shaped upper groove 48 and trapezoidal-shaped lower groove 52 interpenetrate each other as the sum of their depths is greater than the thickness of nozzle tip 12 as measured between the upper and lower faces 50, 54. For example, in one embodiment of the present invention for depositing solder flux, wherein the nozzle tip has a thickness dimension of about 0.040 in., the depth of upper groove 48 is about 0.028 in., and the depth of lower groove 52 is about 0.024 in. Of course, the various dimensions of nozzle tip 40 may change to accommodate for a change in liquid flow rate, liquid viscosity or the desired liquid dispense pattern characteristics of dispensing system 10 without departing from the spirit and scope of the present invention.

Further referring to FIGS. 2A and 2B, nozzle tip 40 further includes a pair of oppositely disposed chamfered end portions 70 formed on the lower end 44 of the nozzle tip 40 that form opposite terminal ends 72 of lower groove 52. More particularly, each chamfered end portion 70 includes a pair of inclined walls 74 that extend outwardly and away from the lower face 54 of nozzle tip 40 and join with the cylindrical wall 46. Each terminal end 72 of lower groove 52 is located between a pair of the inclined walls 74 formed on each chamfered end portion 70. Preferably, each inclined wall 74 is disposed at an angle in a range between about 30° and about 60° relative to a plane defined by the lower face 54 of the nozzle tip 40, and more preferably at an angle of 45°. In this way, the longitudinal length of groove 48 formed on the upper end of nozzle tip 40 is greater than the longitudinal length of lower groove 52 to reduce the volume of liquid material that may collect in lower groove 52 and affect formation of droplets 58. For example, in one embodiment of the present invention for depositing solder flux, upper groove 48 has a length of about 0.120 in., i.e., equal to the diameter of nozzle tip 40, while lower groove 52 has a shorter length of about 0.070 in, although other lengths of grooves 48, 52 are possible without departing from the spirit and scope of the present invention.

Referring now to FIGS. 2A, 2B and 3, nozzle assembly 38 further includes a nozzle tip holder 76 mounted in fluid communication with the outlet end 22 of dispensing system 10 for supporting nozzle tip 40. Nozzle tip holder 76 has a flow passage 78 that fluidly communicates at one end with the outlet opening 28 of valve seat assembly 24. The other end of flow passage 28 fluidly communicates with a cylindrical cavity 80 (FIG. 2B) into which the nozzle tip 40 is brazed or otherwise secured as is known in the art. In this way, flow passage 78 fluidly communicates between the outlet opening 28 and the upper groove 48 formed in the upper face 50 of nozzle tip 40. The diameter and length of flow passage 78 is dependent on the liquid flow rate, liquid viscosity and desired liquid dispense pattern characteristics of dispensing system 10 as will be appreciated by those of ordinary skill in the art.

Nozzle tip holder 76 has an upper, generally planar face 82 (FIG. 3) that is held in contact with the outlet end 22 of dispensing system 10 by a nozzle cap 84 that is threadably engaged on a dispensing stem 86 of liquid dispensing system 10. As shown most clearly in FIGS. 2A and 2B, nozzle tip holder 76 has opposite pairs of inclined walls 88 that form generally linear extensions of the inclined walls 74 formed on the opposite chamfered end portions 70 of nozzle tip 40. Material of nozzle tip holder 76 is removed to form inclined walls 88 during formation of the inclined walls 74 of nozzle tip 40 to reduce liquid material build-up at the terminal ends 72 of lower groove 52, and also to reduce the volume of lower groove 52 as described above. Preferably, nozzle tip 40 is mounted within the cylindrical cavity 80 before the inclined walls 74 of the nozzle tip 40, and the inclined walls 88 of nozzle tip holder 76 are formed by grinding or an equivalent process. Nozzle tip holder 76 also has a pair of spaced ears 90 located on opposite sides of nozzle tip 40 away from chamfered end portions 70 which function to protect the nozzle tip 40 against inadvertent contact with foreign objects.

As best understood with reference to FIGS. 4A–4D and 5, operation of liquid dispensing system 10 will now be described for forming a generally rectangular layer 92 (FIG. 5) of liquid material within a selected component area on substrate 12. Liquid material layer 92 may be a layer of solder flux, surface mount adhesive, chip underfill, epoxy or other liquid or viscous material used in the assembly or packaging of electronic components.

Prior to a dispense cycle, liquid dispensing system 10 is moved to a predetermined X-Y position relative to substrate 12, and set to a predetermined Z position above substrate 12. For dispensing solder flux, for example, nozzle tip 40 is located or set above substrate 12 in a range between about 0.20 in. and about 0.50 in.

Figure 4A:
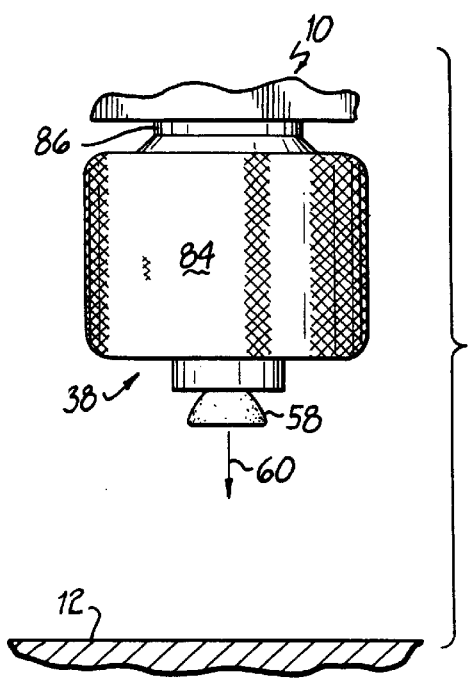
FIGS. 4A–4C are diagrammatic views illustrating the liquid dispensing system of FIG. 1 dispensing a droplet of liquid material onto a substrate.
Figure 4B:
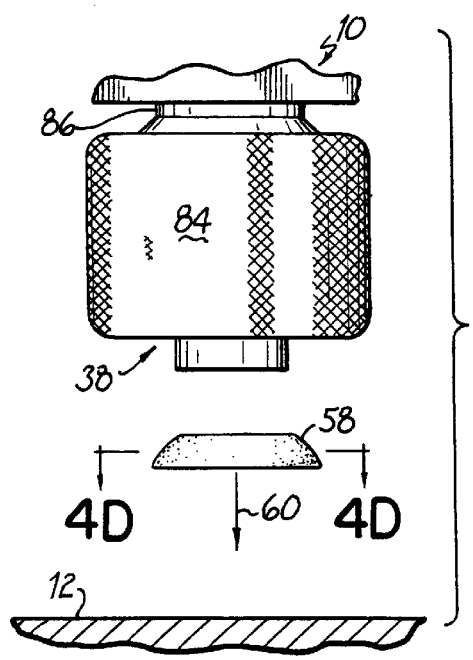
Figure 4C:
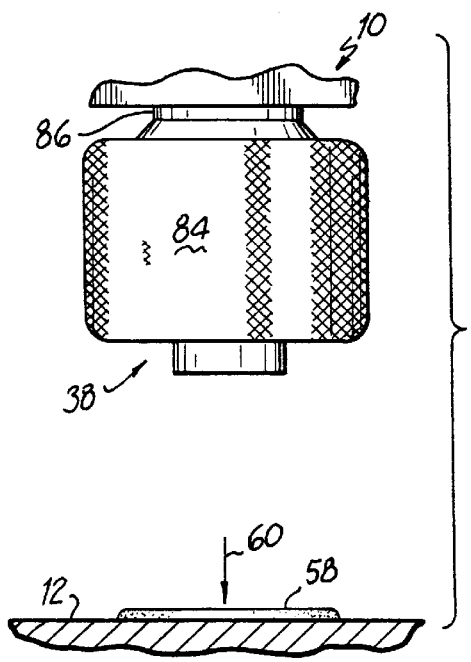

During a dispense cycle for forming a single liquid material droplet 58 as shown in FIGS. 4A–4C, the valve stem 32 is retracted from valve seat 30 to allow a small amount of liquid material to fill flow passage 78 in nozzle tip holder 76, and at least partially fill upper groove 48 in nozzle tip 40. Upon return of the valve stem 32 to the closed position, the droplet 58 of liquid material is dispensed from nozzle tip 40 predominantly by the pressure exerted by valve head 34 returning into sealing engagement with valve seat 30.

In one embodiment of the present invention for dispensing a droplet of solder flux, the valve stem 32 is retracted by control mechanism 36 to open outlet opening 28 in valve seat assembly 24 for a duration of about 5 $\mu$sec. to about 7 $\mu$sec. During this time, the droplet 58 commences to form within nozzle tip 40. As the valve stem 32 is moved back into sealing engagement with valve seat 30, which may have a duration of about 1 msec. or less, the droplet 58 is dispensed or "jetted" from nozzle tip 40 toward the substrate 12 as shown in FIGS. 4A–4C.

Figure 4D:
FIG. 4D is a cross-sectional view taken along line 4D—4D of FIG. 4B.

During the flight of droplet 58 toward the substrate 12, which may have a duration of about 40 msec. to about 60 msec., the droplet 58 elongates in orthogonal directions in a plane that is substantially transverse to the direction of travel 60 of droplet 58. More particularly, droplet 58 elongates in pattern width along an axis that is generally parallel to the longitudinal axis of lower groove 52, and also elongates in pattern length along an axis that is generally transverse to the longitudinal axis of lower groove 52. In this way, the droplet 58 has an elongated, elliptical cross-section as shown in FIG. 4D, with the droplet 58 preferably elongating at least about three times greater, and preferably about five times greater, in pattern width than in pattern length. The droplet 58 impacts the substrate 12 and, as a result of its velocity, immediately flattens into a liquid layer on the substrate 12.

Figure 5:
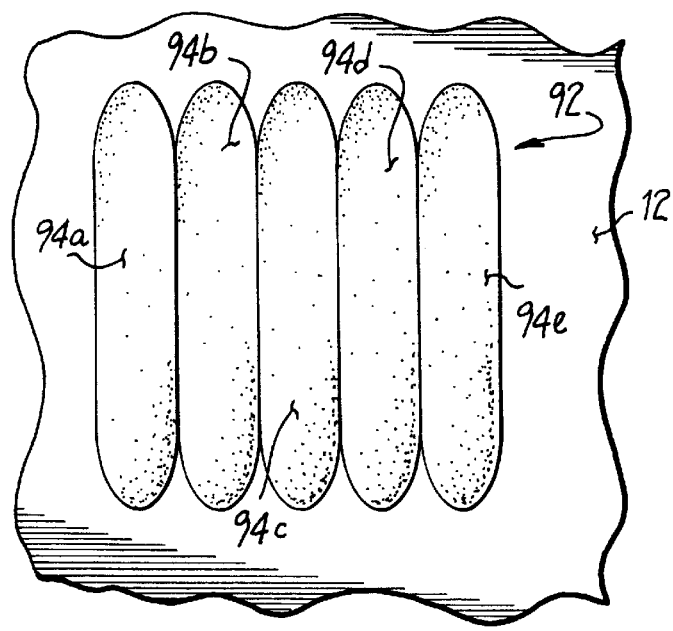
FIG. 5 is a diagrammatic view illustrating a plurality of droplets dispensed onto a substrate that form a generally rectangular layer of liquid material on the substrate.

As best understood with reference to FIG. 5, the generally rectangular liquid layer 92 is formed on substrate 12 by dispensing in spaced relationship a series of droplets 94a–94e within a predetermined rectangular area on substrate 12. Each dispensed droplet 94a–94e impacts the substrate 12, immediately flattens, and contacts an adjacent droplet 94a–94e to form the generally rectangular liquid layer 92 on substrate 12. In one embodiment of the present invention for dispensing solder flux on an FR-4 substrate, each impacted droplet 94a–94e has a pattern width of about 0.30 to about 1.50 in., a pattern length of about 125–250 mils. and a thickness of about 0.10 to about 2.50 mils.

Those of ordinary skill in the art will readily appreciate that liquid dispensing system 10 of the present invention is particularly adapted for forming generally rectangular liquid layers on an electronic substrate. The liquid dispensing system of the present invention advantageously dispenses liquid material droplets that elongate in pattern width and in pattern length during their flight toward the substrate. The elongated droplets impact the substrate and contact adjacent droplets to form generally rectangular liquid layers within predetermined component areas on the substrate. The liquid dispensing system of the present invention eliminates the need to provide for dwell to allow droplets to flow into contact with each other, and also eliminates the need to overlap adjacent droplets to form a generally rectangular layer of liquid material on the substrate, thereby resulting in enhanced throughput of electronic assemblies through the dispensing system.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

Having described the invention, what is claimed is:

1. A nozzle assembly for use in a system to dispense liquid material onto a substrate, comprising:
    a nozzle tip holder;
    a nozzle tip mounted to said nozzle tip holder and configured to dispense a droplet of liquid material toward the substrate that elongates in flight in a plane that is substantially transverse to a direction of travel of the droplet, and having a first end adapted to be placed in fluid flow communication with a liquid material dispensing source and an opposite second end adapted to face the substrate and having a pair of oppositely disposed chamfered end portions formed proximate said second end of said nozzle tip;
    a first elongated cavity formed at said first end of said nozzle tip;
    a second elongated cavity formed at said second end of said nozzle tip and intersecting said first elongated cavity; and
    a liquid dispensing outlet formed by the intersection of said first and second elongated cavities for dispensing liquid material toward the substrate.

2. The nozzle assembly of claim 1, wherein said nozzle tip further comprises a generally cylindrical wall extending between said first and second ends of said nozzle tip.

3. The nozzle assembly of claim 1, wherein the longitudinal length of said first elongated cavity is greater than the longitudinal length of said second elongated cavity.

4. The nozzle assembly of claim 1, wherein said second elongated cavity includes a bottom wall and a pair of side walls extending away from said bottom wall that join with said second end of said nozzle tip.

5. The nozzle assembly of claim 2, wherein each of said oppositely disposed chamfered end portions includes a pair of inclined walls extending outwardly and away from the second end of the nozzle tip that join with said generally cylindrical wall of said nozzle tip.

6. The nozzle assembly of claim 5, wherein each of said inclined walls formed on said chamfered end portions extends outwardly and away from said second end of said nozzle tip at an angle in a range of about 30° to about 60° relative to a plane defined by said second end of said nozzle tip.

7. The nozzle assembly of claim 5, wherein each of said inclined walls formed on said chamfered end portions extends outwardly and away from said second end of said nozzle tip at an angle of about 45° relative to a plane defined by said second end of said nozzle tip.

8. A nozzle assembly for use in a system to dispense liquid material onto a substrate, comprising:
    a nozzle tip holder;
    a nozzle tip mounted to said nozzle tip holder and configured to dispense a droplet of liquid material toward the substrate that elongates in flight in a plane that is substantially transverse to a direction of travel of the droplet, and having a first end adapted to be placed in fluid flow communication with a liquid material dispensing source and an opposite second end adapted to face the substrate;
    a first elongated cavity formed at said first end of said nozzle tip;
    a second elongated cavity formed at said second end of said nozzle tip and intersecting said first elongated cavity;
    the longitudinal length of said first elongated cavity being greater than the longitudinal length of said second elongated cavity; and
    a liquid dispensing outlet formed by the intersection of said first and second elongated cavities for dispensing liquid material toward the substrate.

9. A system for dispensing liquid material onto a substrate, comprising:
    a liquid material dispenser having an outlet end adapted to be placed in fluid flow communication with a source of liquid material;
    a valve assembly associated with said liquid material dispenser for controlling flow of liquid material through said outlet end of said liquid material dispenser; and
    a nozzle assembly mounted in fluid communication with said outlet end of said liquid material dispenser, said nozzle assembly including a nozzle tip configured to dispense a droplet of liquid material toward the substrate that elongates in flight in a plane that is substantially transverse to a direction of travel of the droplet, and having a first end adapted to be placed in fluid flow communication with a liquid material dispensing source and an opposite second end adapted to face the substrate and having a pair of oppositely disposed chamfered end portions formed proximate said second end of said nozzle tip;

a first elongated cavity formed at said first end of said nozzle tip;

a second elongated cavity formed at said second end of said nozzle tip and intersecting said first elongated cavity; and a liquid dispensing outlet formed by the intersection of said first and second elongated cavities for dispensing liquid material toward the substrate.

10. The nozzle assembly of claim 9, wherein said nozzle tip further comprises a generally cylindrical wall extending between said first and second ends of said nozzle tip.

11. The system of claim 10, wherein each of said chamfered end portions includes a pair of inclined walls extending outwardly and away from said second end of said nozzle tip that join with said generally cylindrical wall of the nozzle tip.

12. A system for dispensing liquid material onto a substrate, comprising:

a liquid material dispenser having an outlet end adapted to be placed in fluid flow communication with a source of liquid material;

a valve assembly associated with said liquid material dispenser for controlling flow of liquid material through said outlet end of said liquid material dispenser; and a nozzle assembly mounted in fluid communication with said outlet end of said liquid material dispenser, said nozzle assembly including a nozzle tip configured to dispense a droplet of liquid material toward the substrate that elongates in flight in a plane that is substantially transverse to a direction of travel of the droplet.

13. The system of claim 9, wherein said nozzle assembly further includes a nozzle tip holder mounted adjacent said outlet end of said liquid material dispenser for supporting said nozzle tip.

14. The system of claim 13, wherein said nozzle assembly further comprises a nozzle cap mounted adjacent said outlet end of said liquid material dispenser for supporting the nozzle tip holder.

15. A system for dispensing liquid material onto a substrate, comprising:

a liquid material dispenser having an outlet end adapted to be placed in fluid flow communication with a source of liquid material;

a valve assembly associated with said liquid material dispenser for controlling flow of liquid material through said outlet end of said liquid material dispenser; and a nozzle assembly mounted in fluid communication with said outlet end of said liquid material dispenser, said nozzle assembly including a nozzle tip configured to dispense a droplet of liquid material toward the substrate that elongates in flight in a plane that is substantially transverse to a direction of travel of the droplet, and having a first end adapted to be placed in fluid flow communication with a liquid material dispensing source and an opposite second end adapted to face the substrate;

a first elongated cavity formed at said first end of said nozzle tip;

a second elongated cavity formed at said second end of said nozzle tip and intersecting said first elongated cavity;

the longitudinal length of said first elongated cavity being greater than the longitudinal length of said second elongated cavity; and a liquid dispensing outlet formed by the intersection of said first and second elongated cavities for dispensing liquid material toward the substrate.

* * * * *